(12) United States Patent
Cohen et al.

(10) Patent No.: US 6,665,769 B2
(45) Date of Patent: Dec. 16, 2003

(54) METHOD AND APPARATUS FOR DYNAMICALLY MASKING AN N-BIT MEMORY ARRAY HAVING INDIVIDUALLY PROGRAMMABLE CELLS

(75) Inventors: Zeev Cohen, Safed (IL); Mori Edan, Carmel (IL)

(73) Assignee: Saifun Semiconductors Ltd., Netanya (IL)

( * ) Notice: Subject to any disclaimer, the term of this patent is extended or adjusted under 35 U.S.C. 154(b) by 413 days.

(21) Appl. No.: 09/827,510

(22) Filed: Apr. 5, 2001

(65) Prior Publication Data

US 2002/0194422 A1 Dec. 19, 2002

(51) Int. Cl.$^7$ ............................................. G11C 16/00
(52) U.S. Cl. .................. 711/103; 365/94; 365/189.01; 365/230.01; 713/320; 711/202
(58) Field of Search ................................ 711/103, 202; 713/300, 320; 365/189.01, 230.01, 94

(56) References Cited

U.S. PATENT DOCUMENTS

| | | | | |
|---|---|---|---|---|
| 4,760,555 A | * | 7/1988 | Gelsomini et al. ..... | 365/185.23 |
| 4,761,764 A | * | 8/1988 | Watanabe .............. | 365/185.21 |
| 5,361,343 A | * | 11/1994 | Kosonocky et al. ... | 365/185.11 |
| 5,508,968 A | * | 4/1996 | Collins et al. ............... | 365/227 |
| 5,530,803 A | * | 6/1996 | Chang et al. .................. | 714/42 |
| 5,644,531 A | * | 7/1997 | Kuo et al. ............. | 365/185.11 |
| 5,940,332 A | * | 8/1999 | Artieri .................... | 365/189.08 |

* cited by examiner

Primary Examiner—Hong Kim
(74) Attorney, Agent, or Firm—Eitan, Pearl, Latzer & Cohen Zedek, LLP

(57) ABSTRACT

Disclosed is a method utilizing dynamic masking for efficiently programming an N-bit memory array and, more generally, for mapping successive subsets of data segments into a succession of N-bit auxiliary bytes. When the number of programming bits in an incoming byte exceeds K, a mask maps the bit pattern of the incoming byte into sequential N-bit auxiliary bytes. A first auxiliary byte retains the bit pattern of the incoming byte up to the Kth programming bit, and the remaining bit positions of the first auxiliary byte exhibit a state complementary to the programming bits. A second auxiliary byte retains the bit pattern of the incoming byte starting with the first location after the Kth programming bit and continuing up to the Kth additional programming bit (if any); all remaining bit positions of the second auxiliary byte (including the bit positions that contained programming bits in the first auxiliary byte) exhibit the complementary state. Further auxiliary bytes can be created to accommodate all K programming bits, if necessary.

16 Claims, 7 Drawing Sheets

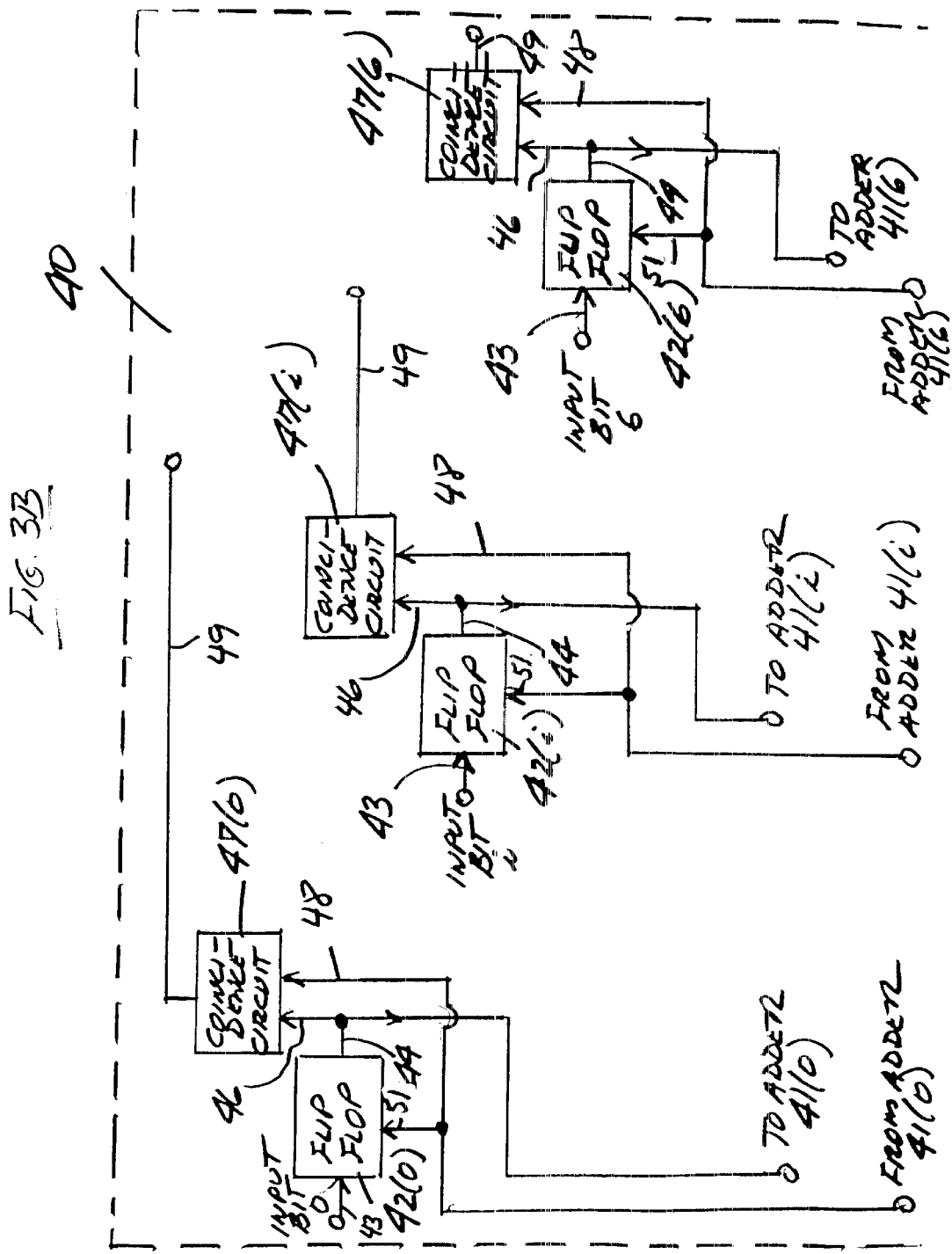

METHOD AND APPARATUS FOR DYNAMICALLY MASKING AN N-BIT MEMORY ARRAY HAVING INDIVIDUALLY PROGRAMMABLE CELLS

FIELD AND BACKGROUND OF THE INVENTION

This invention relates to the programming of an N-bit memory array, such as an EEPROM array, whose cells are individually programmable by bits exhibiting a predetermined one of two complementary logic states. More particularly, this invention relates to methods and apparatus for assuring that no more than a predetermined number K of the cells of such array are simultaneously programmed to prevent overloading of the array power supply.

One technique of this general type is described in U.S. Pat. No. 5,644,531, issued to Kuo et al. on Jul. 1, 1997. The cells of an N-bit memory array are divided into groups to be programmed, and the groups are switched based in part on the location, as well as the number, of the programming bits to be programmed within an incoming N-bit programming byte. The need to create and switch among bit groups results in inefficient programming.

SUMMARY OF THE INVENTION

An improved way of efficiently programming an N-bit memory array while taking into account the power supply-induced limitations mentioned above is afforded by the method and apparatus of the present invention. This technique employs dynamic masking of the array in such a manner that creating cell groups and switching among such are not necessary.

When the number of programming bits in an incoming byte exceeds K, the mask functions to map the bit pattern of the incoming byte into sequential N-bit auxiliary bytes. The first auxiliary byte retains the bit pattern of the incoming byte up to the Kth programming bit, and the remaining bit positions of the first auxiliary byte exhibit a state complementary to the programming bits. The second auxiliary byte retains the bit pattern of the incoming byte starting with the first location after the Kth programming bit and continuing up to the Kth additional programming bit (if any); all remaining bit positions of the second auxiliary byte (including the bit positions that contained programming bits in the first auxiliary byte) exhibit the complementary state. Further auxiliary bytes can be created to accommodate all K programming bits if the first and second auxiliary bytes do not account for all the programming bits in the incoming byte (e.g., where K=3, N=8, and all bits in the incoming byte are programming bits).

The masking arrangement of the invention is adaptable for applications beyond programming memory arrays. In one more generalized embodiment, the mask functions to map successive subsets of data segments into a succession of N-bit auxiliary bytes none of which has more than an individually selectable number of bits exhibiting a predetermined one of two complementary logic states.

BRIEF DESCRIPTION OF THE DRAWINGS

The above and other aspects of the invention are set forth in the following detailed description taken in connection with the appended drawing, in which:

FIGS. 3A–3B illustrate an embodiment of the dynamic mask of FIG. 1 for generalized use in the rapid processing of data stream segments.

DETAILED DESCRIPTION

Figure 1:
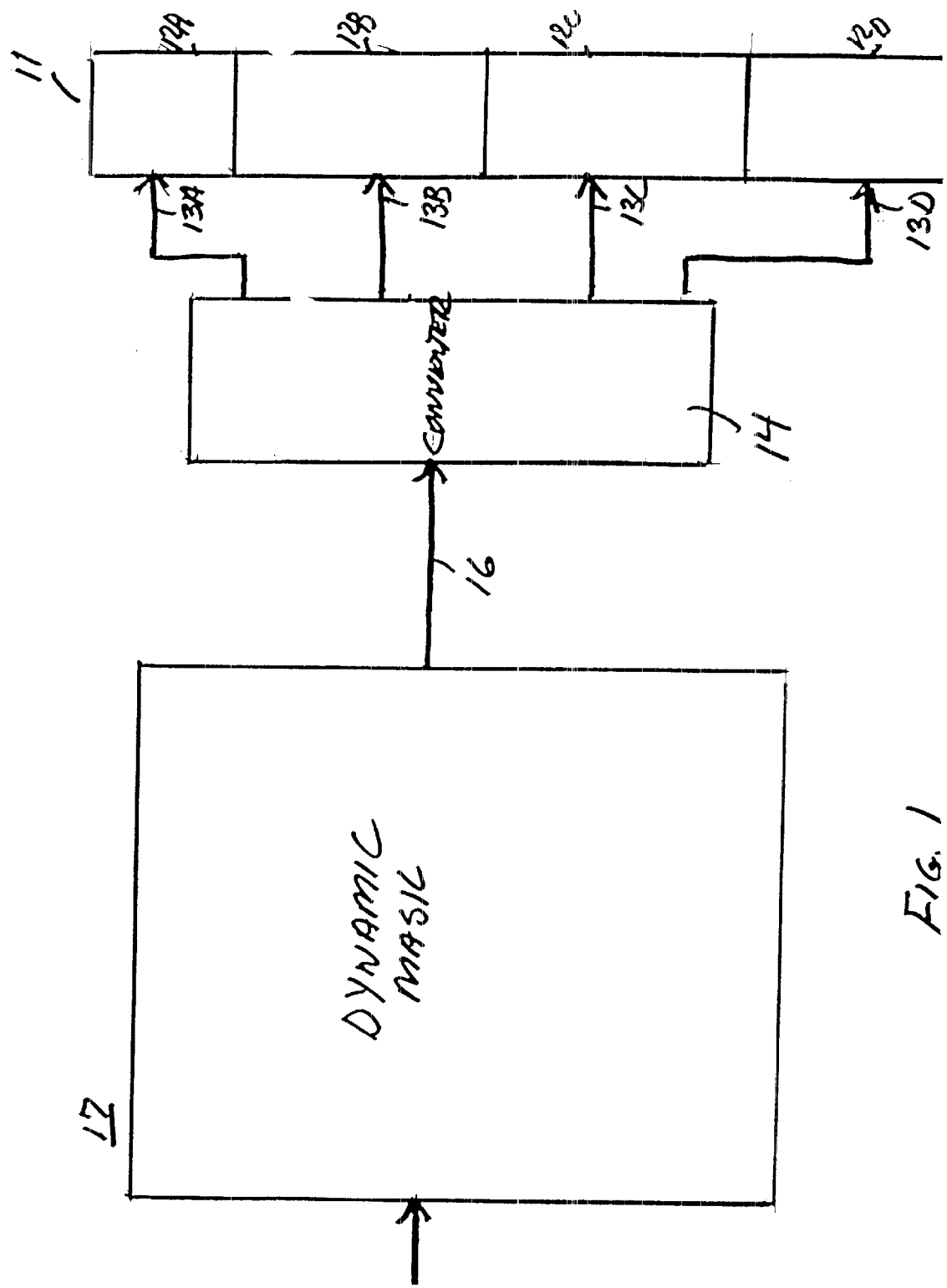
FIG. 1 is a simplified diagram of an overall arrangement for selectively programming an N-bit memory array with the use of a dynamic mask in accordance with the invention.

Referring to the drawing, FIG. 1 depicts a conventional memory array 11, such as an EEPROM array, having a plurality of cells 12A–12D that may be individually programmed by the application of binary bits of a particular logic state (assumed herein to be "0") via input lines 13A–13D, respectively. (While in practice the number of cells in arrays of this type may be equal to 4, 8, 16, or higher multiples, a 4-cell array is considered here for relative ease of description).

Four-bit bytes serially transmitted over a line 16 for programming the array 11 are applied to the array through a converter 14, which directs the separate bits of such bytes to the respective cell input lines 13A–13D for individually programming such cell.

As indicated above, in arrays of this type it is frequently not practical, because of capacity limitations of the array power supply (not shown), to program all of the array cells simultaneously. In practice, a maximum number K of simultaneous programming bits has to be established; and for purposes of this description, K will hereafter be taken as 2.

To accommodate this limitation, it is necessary to assure that no 4-bit programming byte incident on line 16 at any time has a bit pattern containing more than 2 bits having a "0" logic state. In accordance with the invention, this is accomplished in an optimum manner by an adaptive dynamic mask arrangement 17. The mask 17 is represented as being interposed between a line 18, which carries arbitrary 4-bit programming bytes from an external source (not shown), and the line 16.

If the number of "0" state bits of an incoming 4-bit programming byte ("first byte") is equal to or less than 2, the mask will be transparent to such byte, and the bit pattern of such byte received on line 18 will appear unaltered on the output line 16 of the adaptive dynamic mask 17. However, if the number of such "0" state bits of an incoming first byte exceeds 2, the mask operates to map the first byte into sequential 4-bit auxiliary bytes, with no more than 2 bits of each auxiliary byte exhibiting a "0" state.

Specifically, the bit pattern of the first auxiliary byte replicates the bit pattern of the first byte up to the latter's second bit that exhibits a "0" logic state, and all other bits of the first auxiliary byte will exhibit a "1". The second auxiliary byte replicates the portion of the first byte bit pattern starting with the bit position immediately after the position in the first byte that exhibits the second "0" and continuing up to the 2nd additional "0" (if any) of the first byte bit pattern. The other bit positions of the second auxiliary byte will exhibit a "1".

The "0" bit positions of the respective auxiliary bytes are mutually exclusive. Taken together, such positions match the programming bit pattern of the first byte, thereby assuring accuracy in the programming of the respective cells of the array 11.

In the event that a particular choice of N and/or K for an N-bit array to be programmed leaves any programming bits in the first byte still unaccounted for in the first and second auxiliary bytes, the masking algorithm generates additional auxiliary byte(s) to account for all such remaining programming bits. In general, the Tth auxiliary byte generated by the masking algorithm exhibits the bit pattern of the subset of the first byte that starts with the first bit location after the TKth programming bit and that continues to the location of the Kth additional programming bit (if any). Any remaining bit positions of each auxiliary byte will exhibit a logic state different from the programming bits.

Figure 2:
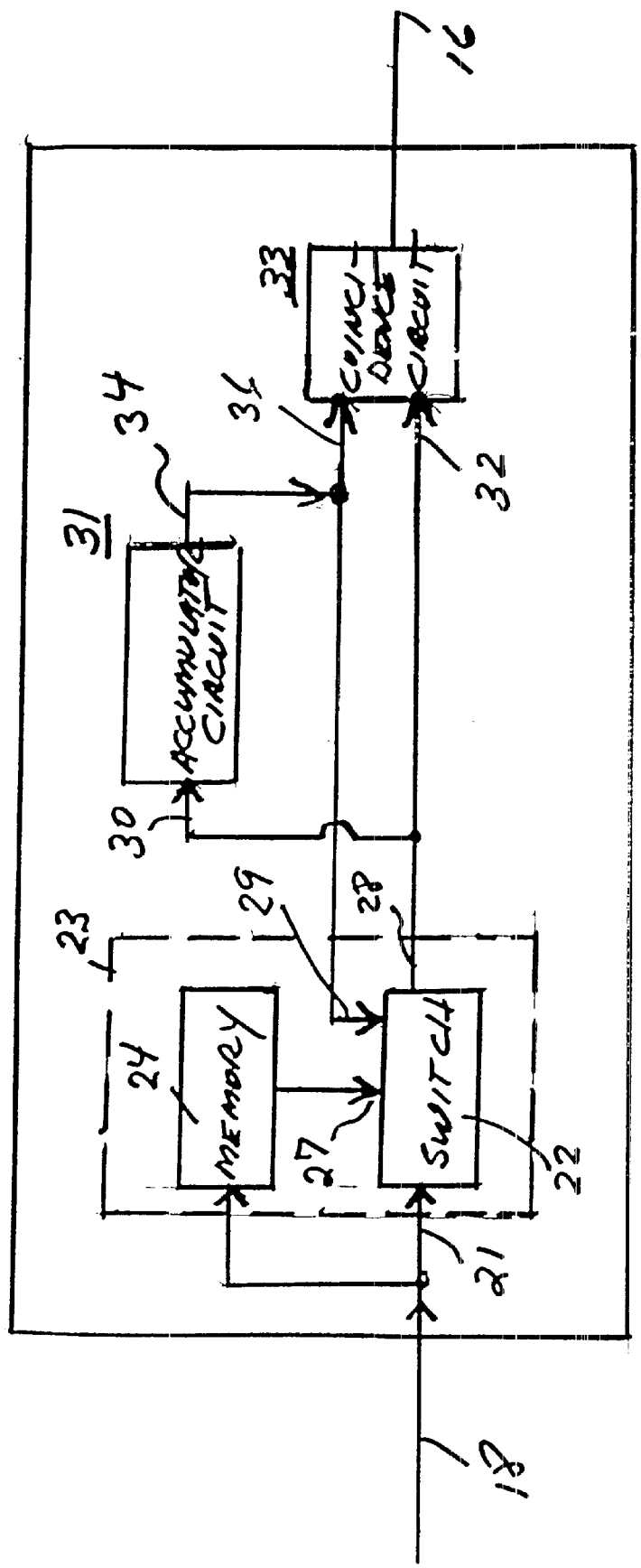
FIG. 2 is a block diagram of one embodiment of the dynamic mask of FIG. 1.

An illustrative embodiment of the dynamic masking arrangement 17 for executing the above-described algorithm to program the 4-bit array 11 of FIG. 1 is shown in FIG. 2. (It will be understood that suitable clock circuitry, not shown, may conventionally be provided to time the various cycles to be described.)

The incoming first programming byte on line 18 is applied to a first data input 21 of a controllable switch 22 forming part of a buffer circuit 23. Such byte is also stored in a memory 24 of the buffer 23. The output of the memory 24 is coupled to a second data input 27 of the circuit 23. An output 28 of the switch 22, which also constitutes the output of the buffer 23, is normally connected internally to the first data input 21 while the switch 22 remains unoperated.

The switch 22 is also provided with a control input 29 which is externally switchable between "0" and "1" logic states. If a change of logic state of the control input 29 occurs, the switch 22 will be operated to direct the second data input 27 to the output 28 after the completion of the current byte cycle. In this way, the bit pattern of the incoming first byte that is stored in the memory 24 will be repeated at the output 28. Each byte appearing at the output 28 is applied to an input 30 of an accumulator circuit 31 and to a data input 32 of a coincidence circuit 33.

The accumulator circuit 31 (which in practice may be conventionally implemented, e.g., with reciprocal serial-parallel converters and binary adders) counts the bits in each incoming 4-bit byte from buffer output 28. When the number of counted bits that exhibit the "0" state exceeds K (in this case, 2), an overflow output 34 of the accumulator 31 is switched from one logic state to the complementary state. The output 34, whose initial logic state is assumed to be "1", is applied to a control input 36 of the coincidence circuit 33 and to the control input 29 of the switch 22 in the buffer 23.

The coincidence circuit 33 may be conventionally implemented so that when control input 36 exhibits a "1" logic state during a particular bit cycle, the coincidence circuit output on line 16 will mirror the logic state of the bit that is then applied to the data input 32. On the other hand, if the control input 36 exhibits a "0" during a particular clock cycle, the output will exhibit a "1" irrespective of the logic state of the bit that is then applied to the data input 32.

The output of the coincidence circuit 33 forms the output of the mask 17. Such output is coupled to the input line 16 of the serial to parallel converter 14 (FIG. 1) that provides programming bits to the respective cells 12A–12D of the array 11.

To illustrate the operation of the embodiment of the masking arrangement 17 of FIG. 2 in carrying out the programming algorithm of the invention, assume first that the bit pattern of the incoming 4-bit programming byte on line 18 ("first byte") is 1010, so that the K=2 limitation stated above is met. The incoming first byte passes through the unoperated switch 22 of the buffer circuit 23 to the accumulator input 30 and the data input 32 of coincidence circuit 33, while a replica of such first byte is stored in buffer memory 24.

Since the number of "0" bits in the byte applied to the accumulator 31 does not exceed 2, the logic state of the overflow output 34 of the accumulator will not be switched during this clock cycle. Therefore, the output of the coincidence circuit 33 on the line 16 during this clock cycle will be as shown in Table 1 below:

TABLE 1

| Data bit state | Control bit state | Output bit state |
|---|---|---|
| 1 | 1 | 1 |
| 0 | 1 | 0 |
| 1 | 1 | 1 |
| 0 | 1 | 0 |

As indicated, the output bit pattern 1010 on the line 16 is identical to the input bit pattern on the line 18, so the mask 17 is seen to be transparent to the incoming first byte when K does not exceed 2.

Assume now that the incoming first programming byte on the line 18 exhibits the bit pattern 0001, so that the K=2 limitation is exceeded. As before, the unoperated buffer switch passes the incoming first byte to the output 28, and a replica of such byte is stored in memory 24. When the replicated bit pattern 0001 at the buffer output 28 is counted in the accumulator 31, the accumulator will overflow after the second "0" bit, and the output 34 will be switched from "1" to "0". As a result, the output of the coincidence circuit 33 will be as shown in Table 2 below:

TABLE 2

| Data bit state | Control bit state | Output bit state |
|---|---|---|
| 0 | 1 | 0 |
| 0 | 1 | 0 |
| 0 | 0 | 1 |
| 1 | 0 | 1 |

The resulting bit pattern 0011 on the line 16 constitutes the first auxiliary byte, which conforms to the applicable step of the inventive algorithm for such byte: it replicates the bit pattern of the incoming byte 0001 up to the latter's second bit that exhibits a "0" logic state, and all other bits of the first auxiliary byte exhibit a "1". Consequently, the incoming byte on line 18 has been dynamically processed to permit a maximum number of bits to be programmed within array power supply constraints.

Since the overflow output 34 of the accumulator 31 is applied to the control input 29 of the buffer switch 22, the above-mentioned change of logic state exhibited by the output 34 when the accumulator processes the bit pattern 0001 also operates the switch 22 and causes the bit pattern replica 0001 stored in the memory 24 to be outputted from the buffer circuit 23 during the following clock cycle.

When the accumulator 31 counts the bits 0001 of the replicated byte, it overflows again after the second "0" bit of such byte. This switches the current logic state of the overflow output 34 from "0" to "1", so that this time the output of the coincidence circuit 33 is as specified in Table 3 below:

TABLE 3

| Data bit state | Control bit state | Output bit state |
|---|---|---|
| 0 | 0 | 1 |
| 0 | 0 | 1 |
| 0 | 1 | 0 |
| 1 | 1 | 1 |

The bit pattern 1101 appearing on the output line 16 of the mask constitutes the second auxiliary byte, and it conforms to the applicable step of the inventive algorithm for such byte: it replicates the portion of the first byte bit pattern in the bit position immediately after the second "0". (It cannot replicate any further than that in this case, since there are no more "0" bits in the first byte). Each of the other bit positions of the second auxiliary byte exhibits a "1", as required by the algorithm.

The auxiliary byte bit patterns 0011 and 1101 on the line 16 are applied in succession through the converter 14 (FIG. 1) to the corresponding cells 12A–12D of the array 11. Since neither of these patterns has more than two "0" bits, and since their composite bit pattern as applied to the array cells exactly matches that of the first programming byte, the array will be safely and accurately programmed.

Figure 3A:
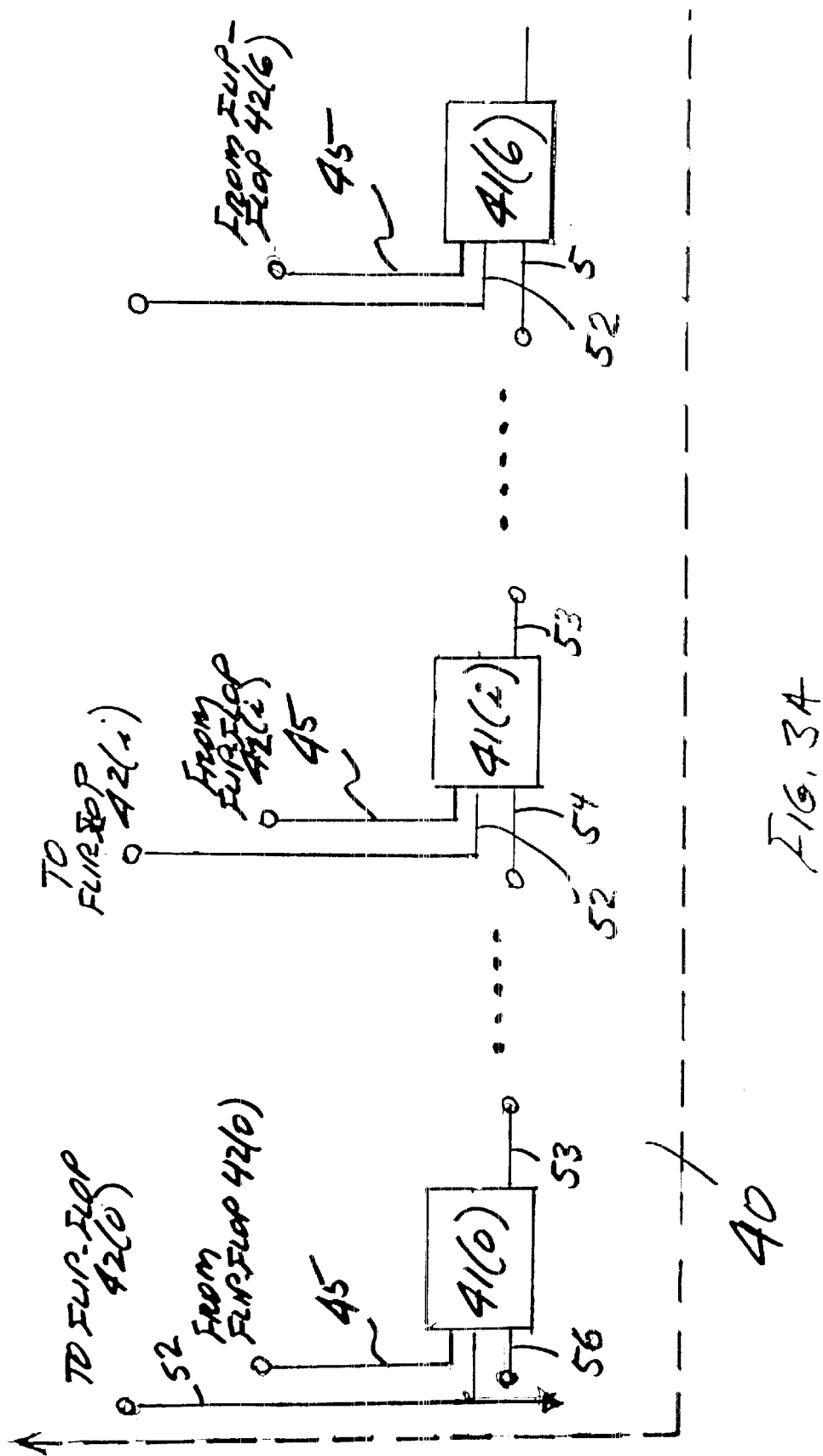

A significant added benefit of the invention is that the masking arrangement 17 for the array 11 can be generalized as a "stand-alone" dynamic mask for the rapid processing of N-bit (illustratively 7 bit) segments of an incoming arbitrary data stream into a succession of N-bit auxiliary bytes each containing no more than K bits exhibiting a predetermined logic state (illustratively "0"). A dynamic mask of this type is indicated at 40 in FIGS. 3A–3B, and will for convenience be illustrated in connection with parallel inputs and outputs. Seven conventional adders 41, three of which are depicted as 41(0), 41(i), and 41(6), are arranged in succession. Each adder 41 will be assumed to be a 3-bit adder solely for purposes of ease of description of the mask operation presented below.

The bits of each seven-bit data segment to be processed are individually presented during a current clock cycle to the adders 41 through seven flip-flops 42, three of which are illustrated as 42(0), 42(i) and 42(6). The flip-flops 42(0), 42(i) and 42(6) are associated with adders 41(0), 41(i) and 41(6), respectively. For this purpose each flip-flop 42 has a data input 43 to which a unique bit of the incoming seven-bit data segment is applied from a suitable source (not shown), and an output 44 which is coupled to a first data input 45 of the associated adder 41. The data inputs 43 of the respective flip-flops 42 define the input of the mask 40.

The output 44 of each flip-flop 42 is also coupled to a data input 46 of an associated one of seven coincidence circuits 47, each of which also has a control input 48 and an output 49. (The three coincidence circuits indicated at 47(0), 47(i) and 47(6) are associated with flip-flops 42(0), 42(i) and 42(6), respectively).

Each flip-flop 42 is conventionally provided with a reset input 51 so arranged that application of a "0" signal to such reset input 51 during the current clock cycle will serve to place the flip-flop output 44 in the "1" state at the start of the next clock cycle.

Each coincidence circuit 47 is conventionally implemented so that when a "0" signal is applied to its control input 48, the output 49 of such coincidence circuit will exhibit a logic state of the bit then applied to its data input 46. On the other hand, if a "1" is applied to the control input 48, the output 49 will exhibit a "1". The outputs 49 of the respective coincidence circuits 47 define the output of the mask 40.

A carry (overflow) output 52 of each adder 41, which normally exhibits a "0" state, is coupled to the reset input 51 of the associated flip-flop 42 and to the control input 48 of the associated coincidence circuit 47. A sum output 53 of each adder 41 is coupled to a second input 54 of the next adder.

The value K for a particular auxiliary byte generated by the mask 40 is determined by an initial numerical offset in the adder 41(0), which offset is externally settable through an offset input 56. For the eight numerical values associated with a 3-bit adder, the value of K will be $K=8-A,$ where A is the numerical offset in the first adder 41(0).

A typical operation of the mask 40 in generating seven-bit auxiliary bytes having no more than K bits with a "0" logic state will now be described in connection with FIGS. 4–6. It will be assumed the offset of the initial adder 41(0) is set at 6 so that K=2, and that the incoming data segment to be processed by the mask 40 is as follows:

0001100.

Figure 4:
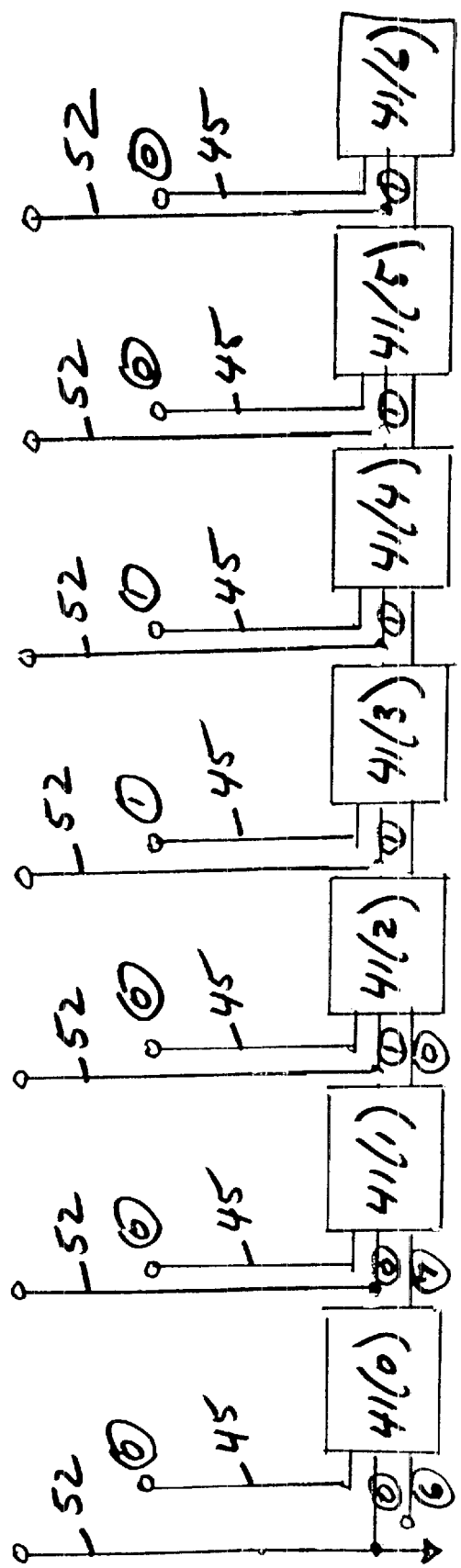
FIGS. 4–6 are schematic representations of the numerical states, during successive clock cycles, in an arrangement of 3-bit adders usable in the dynamic mask of FIGS. 3A–3B.
Figure 5:
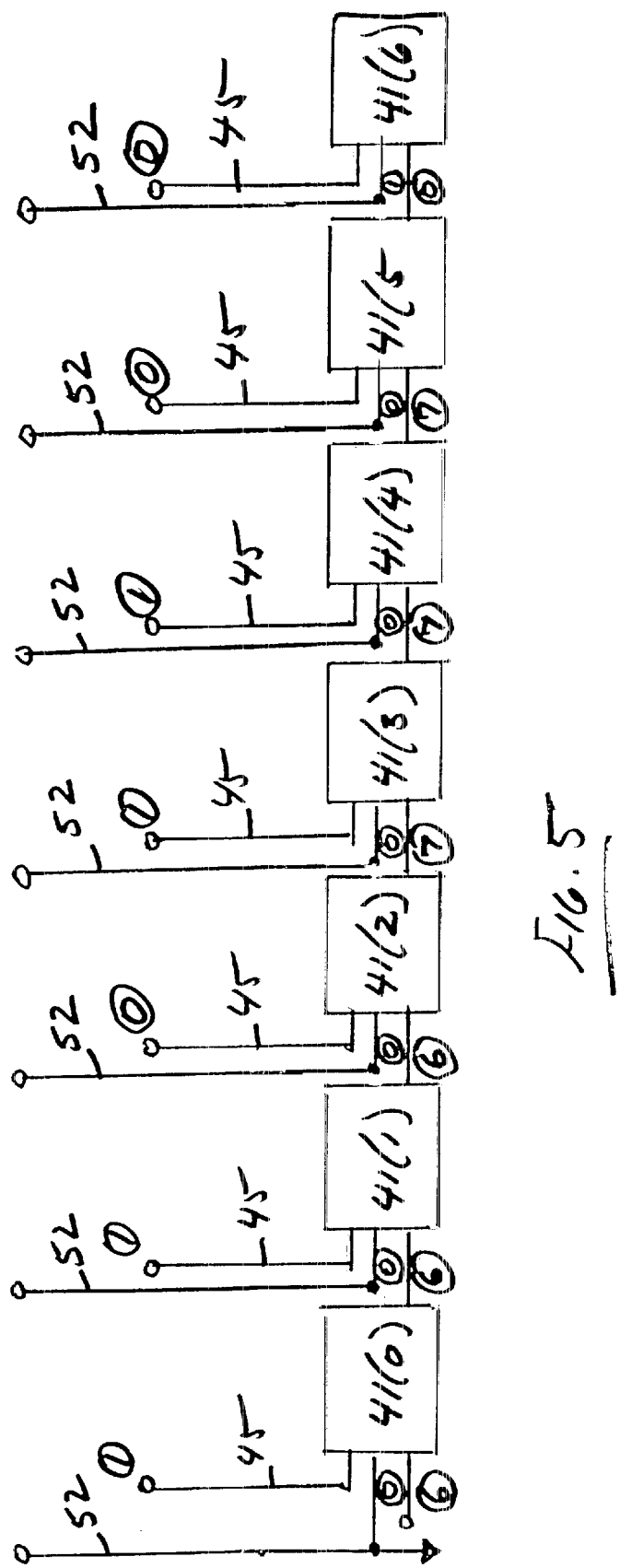

FIG. 4 indicates the numerical state of each of the seven three-bit adders 41(0)–41(6) during a first clock cycle of the mask 40. Since the mask 40 is arranged to program bits with a "0" logic state, each adder 41 is arranged to increment the numerical value at its sum output 53 upon receipt of a "0" bit on its data input 45. When the value at the output of the adder is incremented from 7 to 0, the carry output of each of the following adders will exhibit a "1".

During a first clock cycle, the bits 0001100 of the selected incoming data stream segment are applied to the respective flip-flop data inputs 43. Such bits, which are initially replicated at the outputs 44 of the flip flops 42, are applied to the first data inputs 45 of the associated adders 41 as depicted schematically in FIG. 4.

In response to the "0" bit applied to the data input 45 of the first adder 41(0), the value appearing on its sum output 54 will be incremented to 7. The data input of the next adder 41(1) is also "0", and the numerical output of such adder is incremented from 7 to 0. Consequently, the carry outputs 52 of the remaining adders 41(2)–41(6) will exhibit a "1".

The "0" signals present on the carry output 52 of the first two adders 41(0) and 41(1) are applied to the control inputs 48 (FIG. 3B) of the corresponding coincidence circuits 47 and to the reset inputs 51 of the corresponding flip-flops 42. As a result, the outputs of such coincidence circuits 47 will mirror the first two bits in the input data segment 0001100 applied to their respective data inputs 46 from the outputs 44 of the associated flip-flops 42. By contrast, the "1" signals present on the carry outputs 52 of the remaining adders 41(2)–41(6) are applied to the control inputs 48 of the corresponding five coincidence circuits 47. This will cause the outputs of the latter circuits to exhibit a "1". Hence the first auxiliary byte at the output of the mask 40 will be

0011111.

It will be appreciated that what the mask 40 has done during this first clock cycle is to rapidly process a first subset of the incoming seven-bit data segment 0001100 into a first seven-bit auxiliary byte that contains no more than two "0" bits. The first subset extends from the start of the data segment to the bit position of the second "0" bit in such segment; in this case, the first subset encompasses the first two bit positions of the segment.

To continue processing of the incoming data segment 0001100, such segment is re-applied intact to the flip-flop inputs 43 at the start of the next (second) clock cycle. However, since the "0" signals present at the carry outputs of the adders 41(0) and 41(1) during the first clock cycle are effective to reset the corresponding flip-flops to "1" for the second clock cycle, the actual bit pattern applied to the data inputs 45 of the adders during the second clock cycle is

1101100.

The operation of the mask 40 during this new clock cycle will now be described in connection with FIG. 5. The arrangement of FIG. 5 is similar to that just described in connection with FIG. 4, but with the various bit states and/or numerical values being appropriate to the new clock cycle.

Since the input data bits for each of the first two adders 41(0) and 41(1) are each "1", the numerical values appearing on their sum outputs will remain at 6. The data input bit for the next adder 41(2) is "0", so the count of that adder is incremented to 7. This count will not change for the next two adders 41(3) and 41(4) because their respective input data bits are "1". However, since the input data bit of the following adder 44(5) is "0", the sum output of such adder is switched from 7 to 0, and the carry output 52 of the last adder 41(6) will exhibit a "1".

The "0" states now present on the carry outputs 52 of the first six adders 41(0)–41(5) are applied to the control inputs 48 (FIG. 3B) of the corresponding six coincidence circuits 47. Therefore, the bit pattern on the outputs 49 of such coincidence circuits will mirror the pattern of the first six bits 110110 appearing at he outputs 44 of the associated flip-flops. Conversely, the "1" state now present on the carry output 52 of the remaining adder 41(6) will cause the output of the corresponding coincidence circuit to exhibit a "1". Hence the output of the mask 40 for this second clock period is

1101101, so that a second subset 0110 of the original data segment 0001100 has now been processed into a second auxiliary byte having no more than two "0" bits. Such second subset starts with the first bit position after the end of the first subset, and continues to the bit position exhibiting the fourth "0" bit in original data segment.

At this point, there is still one "0" bit of the original data segment 0001100 which has not yet been processed by the mask 40. Therefore, such segment is again applied to the data inputs 43 of the flip-flops 42 for further processing during a third clock segment as will now be explained in connection with FIG. 6.

Again, the bit pattern actually applied to the adders 41 from the outputs 44 of the flip-flops 42 at the start of the third clock cycle will be different because the "0" signals on the carry outputs 52 of the adders 41(0)–41(5) during the second clock cycle serves to reset the corresponding flip flops 42 to "1". As a result, the actual bit pattern applied to the data inputs 45 of the adders 41 during the third clock cycle is

1111110.

Figure 6:
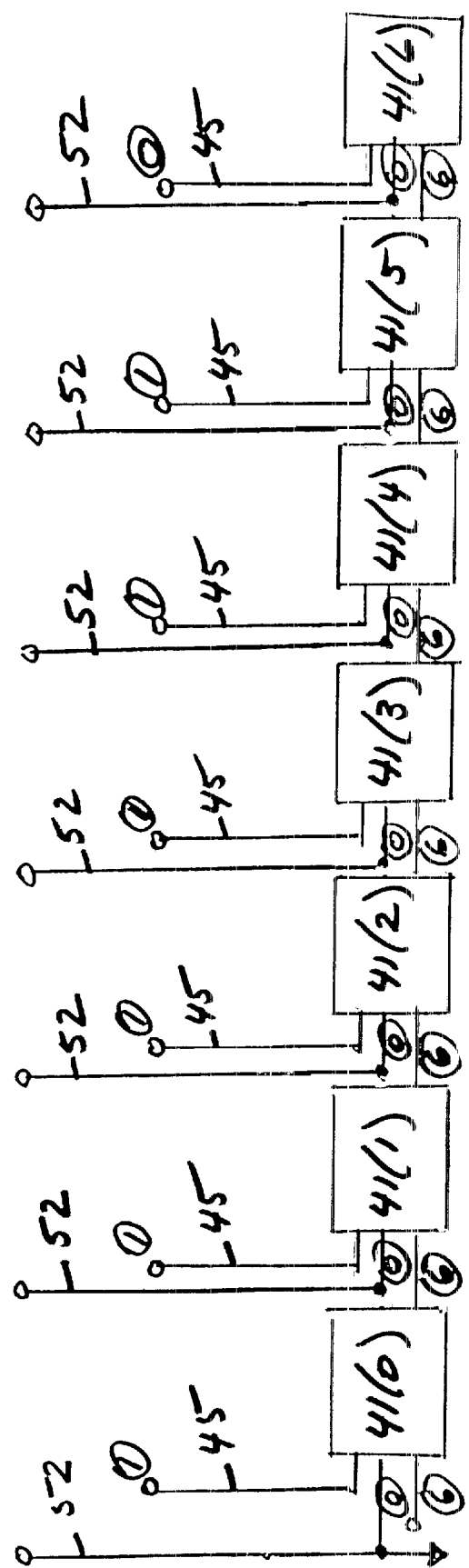

As shown in FIG. 6, such bit pattern 41 leads to a state configuration whereby none of the adders 41 is incremented beyond a level of 7. Therefore, the carry outputs 52 of all the adders, and accordingly the control inputs 48 of all of the coincidence circuits 47, will be "0". The bit pattern at the output of the mask 40 will then fully mirror the bit pattern at the outputs 44 of the flip-flops 42, i.e.,

1111110, so that a third subset of the original data stream segment 0001100 has now been processed into a third auxiliary byte having no more than two "0" bits. Such third subset commences with the first bit position after the end of the second subset and continues to the bit position, if any, exhibiting the sixth "0" bit in the original data segment. (In this case, however, the original data segment is not long enough to exhibit a sixth "0" bit.)

The numerical offset A of the first adder 41(0) may be set anywhere within the capacity of such adder for each of the clock cycles in which an auxiliary byte is to be generated. (For example, with the three-bit adder assumed, the offset value for each auxiliary byte may be set at any value from 0 to 7.) As a result, each auxiliary byte generated by the mask 40 may, if desired, exhibit a different value of K.

In the foregoing, the invention has been described, in part, in connection with exemplary embodiments thereof. Many variations and modifications will now occur to those skilled in the art. For example, while the invention has been illustrated in connection with the mapping of segments of binary bits into a succession of N-bit bytes none of which contains more than a selected number of bits representing a prescribed one of two complementary states, the invention is generally applicable to the mapping of a segment of numerical symbols into a succession of N-symbol groups none of which has more than a selected number of symbols representing a given value. It is accordingly desired that the scope of the appended claims not be limited to or by such exemplary embodiments.

What is claimed is:

1. In a method of programming an N-bit memory array, whose cells are individually programmable by programming bits that exhibit a predetermined logic state using the bit pattern of an arbitrary N-bit first byte, in such a manner that no more than K cells are simultaneously programmed, the steps of:

generating a first N-bit auxiliary programming byte which replicates the bit pattern of the first byte up to the Kth programming bit, and otherwise exhibits bits whose logic state is different from that of the programming bits; applying the bit pattern of the first auxiliary byte to the respective cells of the array;

generating a second N-bit auxiliary programming byte which replicates the bit pattern of the first byte starting with the first bit position after the Kth programming bit and continuing to the Kth additional programming bit (if any), and otherwise exhibits bits whose logic state is different from that of the programming bits; and applying the bit pattern of the second auxiliary byte to the respective cells of the array.

2. In a method of programming an N-bit memory array, whose cells are individually programmable by first bits that exhibit a predetermined logic state, in such a manner that no more than K cells are simultaneously programmed, the steps of counting the number of first bits in a first N-bit programming byte; if the number of first bits counted in the first byte exceeds K, generating a second N-bit programming byte which replicates the bit pattern of the first byte up to the Kth first bit and thereafter exhibits bits whose logic state is different from that of the first bits;

applying the bit pattern of the second byte to the respective cells of the array;

if the number of first bits counted in the first byte exceeds K, generating a third N-bit programming byte which replicates the bit pattern of the first byte after the Kth first bit but otherwise exhibits bits whose logic state is different from that of the first bits; and applying the bit pattern of the third byte to the respective cells of the array.

3. Apparatus for dynamically masking an N-bit memory array whose cells are individually programmable by first bits that exhibit a predetermined logic state, which comprises:

an accumulator having an input for receiving N-bit bytes and an output that exhibits one of two complementary logic states, means for counting the bits of each byte applied to the input of the accumulator, and means for switching the logic state of the accumulator output if and when the counted number of first bits of the byte applied to the accumulator input during a current byte cycle exceeds K;

switching means for normally applying arbitrary N-bit bytes to the accumulator input, the switching means being operable to apply to the accumulator input, during a subsequent byte cycle, a replica of the byte applied to the accumulator input during the current byte cycle;

means for operating the switching means when the logic state of the accumulator output is switched;

a coincidence circuit having a data input, a control input and an output;

means for applying, to the data input of the coincidence circuit; N-bit bytes applied to the accumulator input by the switching means;

means for applying the output of the accumulator to the control input of the coincidence circuit; and means for coupling the output of the coincidence circuit to the respective cells of the array.

4. Apparatus for dynamically masking an N-bit memory array whose cells are individually programmable by first bits that exhibit a predetermined logic state, which comprises:

an accumulator having an input for receiving N-bit bytes and an output that exhibits one of two complementary logic states, means for counting the bits of each byte applied to the input of the accumulator, and means for switching the logic state of the accumulator output if and when the counted number of first bits in the incoming byte exceeds K;

a buffer circuit comprising a switch having a first data input for receiving N-bit bytes, a memory for storing such bytes, a second data input for receiving bytes stored in the memory, a control input operable between two complementary logic states, an output normally connected to the first data input, and means for connecting the output of the buffer circuit to the second data input upon a change in logic state of the control input;

a coincidence circuit having first and second inputs and an output;

means for applying the output of the buffer circuit to the input of the accumulator and to the first input of the coincidence circuit;

means for applying the output of the accumulator to the control input of the buffer circuit and the second input of the coincidence circuit; and means for coupling the output of the coincidence circuit to the respective cells of the array.

5. A method of processing a data segment into a succession of N-bit bytes none of which has more than an individually selected number of bits representing a predetermined value, which comprises the steps of:

extracting, from the data segment, a first subset whose bit pattern contains K first bits representing the same value, where K is no greater than N;

mapping such first subset into a first N-bit byte whose bit pattern replicates the bit pattern of the first subset up to the position of the Kth first bit and otherwise exhibits bits whose value is arbitrarily set;

extracting, from the data segment, a second subset which commences at the bit position immediately after that of the Kth first bit of the first subset and which has a bit pattern containing M first bits, where M is no greater than N; and mapping such second subset into a second N-bit byte whose bit pattern replicates the bit pattern of the second subset up to the position of the Mth first bit and otherwise exhibits bits whose value is arbitrarily set.

6. A method as defined in claim 5, in which the bits other than the first bits are set at a value different from that of the first bits.

7. A method as defined in claim 5, where M=K.

8. A method as defined in claim 7, in which the bits other than the first bits are set at a value different from that of the first bits.

9. A method of processing a data segment into a succession of N-bit bytes none of which has more than an individually selected number of first bits representing a predetermined value, which comprises the steps of:

extracting, from the data segment, successive subsets each of whose bit patterns contains an individually selected number, no greater than N, of first bits representing the same value; and mapping each such subset into a separate N-bit byte whose bit pattern replicates the bit pattern of the corresponding subset up to the position of the last of the selected number of first bits in such subset, and otherwise contains bits whose value is different from that of the first bits.

10. A method as defined in claim 8, in which the number of first bits in each N-bit byte is the same.

11. A method of processing a data segment into a succession of N-bit bytes none of which has more than an individually selected number of first bits exhibiting a predetermined logic state, which comprises the steps of:

extracting, from the data segment, a first subset whose bit pattern contains K first bits, where K is no greater than N;

mapping such first subset into a first N-bit byte whose bit pattern replicates the bit pattern of the first subset up to the position of the Kth first bit and otherwise exhibits bits whose logic state is different from that of the first bits;

extracting, from the data segment, a second subset which commences at the bit position immediately after that of the Kth first bit of the first subset and which has a bit pattern containing M first bits, where M is no greater than N; and mapping such second subset into a second N-bit byte whose bit pattern replicates the bit pattern of the second subset up to the position of the Mth first bit and otherwise exhibits bits whose logic state is different from that of the first bits.

12. A method as defined in claim 11, where M=K.

13. A method of processing a segment of numerical symbols into a succession of N-symbol groups none of which has more than an individually selected number of symbols representing a predetermined value, which comprises the steps of:

extracting, from the segment, successive subsets each of whose symbol patterns contains an individually selected number of first symbols of the same value; and mapping each such subset into a separate N-symbol group whose symbol pattern replicates the symbol pattern of the corresponding subset up to the position of the last of the selected number of first symbols in such subset, and otherwise exhibits symbols whose value is different from that of the first symbols.

14. A method as defined in claim 13, in which the number of first symbols in each N-symbol group is the same.

15. A method of programming an N-bit memory array, whose cells are individually programmable by first programming bits that exhibit a predetermined logic state using the bit pattern of an arbitrary N-bit first byte, in such a manner that no more than K cells are simultaneously programmed, which comprises the steps of:

extracting, from the first byte, successive subsets each of whose bit patterns contains an individually selected number, no greater than K, of first programming bits;

mapping each such subset into a separate N-bit auxiliary byte whose bit pattern replicates the bit pattern of the corresponding subset up to the position of the last of the selected number of first programming bits in such subset, and otherwise contains bits exhibiting a logic state different from that of the first programming bits; and applying each auxiliary byte to the array.

16. A method as defined in claim 15, in which the number of first programming bits in each auxiliary byte is the same.

* * * * *